United States Patent
Egawa et al.

(10) Patent No.: US 6,955,966 B2
(45) Date of Patent: Oct. 18, 2005

(54) METHOD OF MANUFACTURING NON-VOLATILE READ ONLY MEMORY

(75) Inventors: Noboru Egawa, Tokyo (JP); Hitoshi Kokubun, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/895,382

(22) Filed: Jul. 21, 2004

(65) Prior Publication Data

US 2004/0259301 A1 Dec. 23, 2004

Related U.S. Application Data

(62) Division of application No. 10/230,053, filed on Aug. 29, 2002, now Pat. No. 6,780,710, which is a division of application No. 09/852,789, filed on May 11, 2001, now Pat. No. 6,487,119.

(30) Foreign Application Priority Data

Nov. 17, 2000  (JP) ........................................ 2000-350903

(51) Int. Cl.[7] ............................................ H01L 21/336
(52) U.S. Cl. ....................... 438/257; 438/258; 257/315; 257/316
(58) Field of Search ................................ 438/257–259, 438/593; 257/315–316

(56) References Cited

U.S. PATENT DOCUMENTS

| | | | |
|---|---|---|---|
| 5,889,711 A | 3/1999 | Yang et al. | |
| 5,959,877 A | 9/1999 | Takahashi | |
| 6,243,293 B1 | 6/2001 | Van Houdt et al. | |
| 6,246,607 B1 | 6/2001 | Mang et al. | |
| 6,461,916 B1 * | 10/2002 | Adachi et al. | ............... 438/257 |
| 6,498,365 B1 | 12/2002 | Wakamiya | |
| 6,538,270 B1 | 3/2003 | Randolph et al. | |
| 6,611,457 B2 | 8/2003 | Egawa | |

FOREIGN PATENT DOCUMENTS

| | | |
|---|---|---|
| JP | 53020777 | 2/1978 |
| JP | 02000355 | 1/1990 |
| JP | 3-1396 A | 1/1991 |
| JP | 3-19372 A | 1/1991 |
| JP | 05055560 | 3/1993 |
| JP | 08153806 | 6/1995 |
| JP | 08288408 | 11/1996 |
| JP | 08316341 | 11/1996 |
| JP | 62194662 | 8/1997 |
| JP | 04256360 | 9/2002 |

OTHER PUBLICATIONS

Betty Prince, "Semiconductor Memories", 1983, Wiley, 2nd edition, pp. 37 & 38.

* cited by examiner

*Primary Examiner*—Dung A. Le
(74) *Attorney, Agent, or Firm*—Volentine Francos & Whitt, P.L.L.C.

(57) ABSTRACT

A method of manufacturing a mask ROM for storing quaternary data enables short turn around time, makes refining cell sizes simple, and enables stable reading of data. Gaps are formed between word lines in the memory cell transistors and two diffusion areas in accordance with quaternary write data. A current runs between these diffusion areas only when one of these two areas which is adjacent a gap is used as a drain. Accordingly, quaternary data can be read by a first reading when the first diffusion area is a source and the other diffusion area is a drain, and by reading a second reading when the first diffusion area is used as a drain and the other diffusion area as a source.

14 Claims, 13 Drawing Sheets

METHOD OF MANUFACTURING NON-VOLATILE READ ONLY MEMORY

CROSS REFERENCE TO RELATED APPLICATIONS

This is a divisional application of application Ser. No. 10/230,053, filed Aug. 29, 2002, now U.S. Pat. No. 6,780,710 which is a divisional application of Ser. No. 09/852,789 filed May 11, 2001, now U.S. Pat. No. 6,487,119, which are hereby incorporated by reference in their entirety for all purposes.

BACKGROUND OF THE INVENTION

1. Field of the Invention

The present invention relates to non-volatile ROM (Read Only Memory) such as mask ROM and More specifically, the present invention relates to non-volatile ROM which can store quaternary data.

2. Description of Related Art

Mask ROM is an example of known non-volatile Read Only Memory. Mask ROM that is able to write quaternary data into each memory cell transistor has been known for some time. A large amount of information can be stored in small circuits using this mask ROM. Examples of known mask ROM that can store quaternary data include the mask ROM disclosed in Japanese Laid-open Publication No. 1996-316341 (hereinafter referred to as Document 1) and the mask ROM disclosed in Japanese Laid-open Publication No. 1996-288408 (hereinafter referred to as Document 2).

The mask ROM of Document 1 achieves storing the quaternary data by using the fact that the threshold value of a cell transistor changes when a lightly doped drain (LDD) area is provided in the diffusion area. In other words, the threshold value of transistor changes depending on the type of structure adopted: a structure in which an LDD area is provided in both the source area and drain area; a structure in which an LDD area is provided only in the source area; a structure in which an LDD area is provided only in the drain area; or a structure in which an LDD area is provided in neither the source area or drain area. The differences in the threshold value are determined by comparing the current between source and drain when the prescribed gate voltage is applied to each transistor.

The mask ROM of Document 2 achieves storing the quaternary data by using the fact that when a p+ diffusion area is provided next to an n-type source area the cell transistors are non-conductive whereas when a p+ diffusion area is provided next to an n-type drain area the cell transistors are conductive. In other words, when a p+ diffusion area is placed next to only one of two n-type diffusion areas in a cell transistor, the cell transistor is conductive when this n-type diffusion area is used as the source, but the cell transistor is not conductive when the other n-type diffusion area is used as the source. Also, when p+ diffusion areas are provided in both n-type diffusion areas in a cell transistor, the cell transistor is not conductive regardless of which n-type diffusion area is used as the source. Furthermore, in cell transistors without any p+ diffusion area, the cell transistor is conductive no matter which n-type diffusion area is used as the source. Accordingly, storing quaternary data is achieved by adopting either of the following structures: a structure in which both of n-type diffusion areas are provided with a p+ diffusion area; a structure in which only one n-type diffusion area is provided with a p+ diffusion area; a structure in which the other n-type diffusion area is provided with a p+ diffusion area; or a structure in which no n-type diffusion area is provided with a p+ diffusion area. Quaternary data can then be read using combinations of the distinction of conductive and non-conductive of a cell transistor when one diffusion area is used as the source and the distinction of conductive and non-conductive of the cell transistor when the other diffusion area is used as the source.

Also, the mask ROM of Document 2 uses n-type source areas and n-type drain areas as wiring, and forms word lines as gate electrodes by making them cross over these n-type source areas and n-type drain areas.

However, the mask ROMs according to Documents 1 and 2 have the following disadvantages.

One of the disadvantages of the mask ROM of Document 1 is the lengthy Turn Around Time (TAT). TAT is the time required from presentation of a program with writing data by the user to its delivery by mask ROM. To reduce TAT, it is preferable that as few processes as possible come after data is written, that is, it is preferable to ensure that as many processes as possible are common processes that can be implemented before data is written. However, in the mask ROM of Document 1, the LDD creation process, which is the data writing process, must be implemented prior to the creation of the source diffusion area and drain diffusion area. Therefore, the source and drain diffusion areas cannot be created in a common process and accordingly there is a lengthy TAT.

Furthermore, because there is only a small difference in the threshold values based on the LDD area, the read data in the mask ROM in Document 1 is not adequately reliable.

On the other hand, the disadvantage of the mask ROM of Document 2 is that the p+ diffusion layer is difficult to create. In other words, in this mask ROM, data is written (that is, the p+ diffusion area is created) after word lines are formed and so the p+ diffusion area with high reliability cannot be formed. Also, in this mask ROM, a diffusion area with a conductivity that is the opposite of the conductivity of the source and drain areas (that is p conductivity) must be formed in an extremely small area, however, it is difficult to form photo resistors for implantation of impurities in a small area and therefore, it is difficult to refine cell sizes and very accurately control cell currents.

Furthermore, the mask ROM in Document 2 uses n-type source areas and n-type drain areas as wiring and so line resistance is high. This has the disadvantage of inhibiting fast and stable reading of data.

SUMMARY OF THE INVENTION

An object of the present invention is to provide a non-volatile Read Only Memory with a short TAT, in which cells can be easily refined and data can be read with stability.

To enable this, the non-volatile Read Only Memory according to the present invention comprises: memory cell transistors each of which is constituted such that the area between the gate electrode and one impurity area and the area between the gate electrode and the other impurity area take offset structure or non-offset structure in accordance with the value of stored data; a row selection line that applies a voltage to the gate electrodes in the memory cell transistors belonging to same row; a first column selection line that applies a voltage to the one impurity area in the memory cell transistors belonging to same column; a second column selection line that applies a voltage to the other impurity area in the memory cell transistors belonging to same column; and reading means which applies a read electric potential to the row selection line selected, and reads the stored data by detecting the on/off status of the memory cell transistors when high electric potential is applied to the first column selection line and low electric potential is applied to the second column selection line, and by detecting the on/off status of the memory cell transistors when low electric potential is applied to the first column selection line and high electric potential is applied to the second column selection line.

The memory relating to the present invention writes data using the offset or non-offset structure of the memory cell transistors. The data is then read according to the combination of the on/off status of memory cell transistors when a high electric potential is applied to the first column selection line and a low electric potential is applied to the second column selection line and the on/off status of memory cell transistors when a low electric potential is applied to the first column selection line and a high electric potential is applied to the second column selection line.

In the present invention, an "offset structure" describes a structure in which an ON-current flows in a transistor when the impurity area is used as a drain in that transistor but in which an ON-current does not flow when the impurity area is used as a source. Also, in the present invention, a "non-offset structure" describes a structure in which an ON-current flows in a transistor when the impurity area is used either as a drain or as a source in that transistor.

A first manufacturing method relating to the present invention comprises: a first common process for forming an gate oxide film on a semiconductor substrate; a second common process for forming a gate electrode on the gate oxide film; a third common process for forming one impurity area and other impurity area at the surface of the semiconductor substrate so that gaps of the width corresponding to the offset structure are formed between these areas and the gate electrodes; and an individual process for forming the non-offset structure by doping into the gaps impurities of the same conductivity as impurities doped into the impurity area in accordance with quaternary writing data.

A second manufacturing method relating to the present invention comprises: a first common process for forming an gate oxide film on a semiconductor substrate; a second common process for forming a gate electrode on the gate oxide film so that gaps of the width corresponding to the offset structure are formed between the opposite ends of the gate oxide film and the gate electrode; a third common process for forming one impurity area and another impurity area at the surface of the semiconductor substrate so as to adjoin the gate electrode via the gap; a fourth common process for forming non-conductive data write layers in the gaps on the gate oxide film, respectively; and an individual process for forming the non-offset structure by making the data write area conductive in accordance with quaternary writing data.

A third manufacturing method relating to the present invention comprises: a first common process for forming an oxide gate layer on a semiconductor substrate; a second common process for forming a gate electrode on the gate oxide film so that gaps of the width corresponding to the offset structure are formed between the opposite ends of the gate oxide film and the gate electrode; a third common process for forming one impurity area and another impurity area on the surface of the semiconductor substrate so as to adjoin the gate electrodes via the gaps; and an individual process for forming the non-offset structure by depositing a data storing gate electrode in the gap on the gate oxide film in accordance with quaternary writing data.

A fourth manufacturing method relating to the present invention comprises: a first individual process for forming an gate oxide film on a semiconductor substrate, such that distance between the opposite ends of the gate oxide film and impurity area formation areas are set so as to form the offset structure or non-offset structure in accordance with quaternary writing data; a second individual process for forming gate electrode on entire of the gate oxide film; and a third individual process for forming one impurity area and other impurity area at the surface of the semiconductor substrate, such that those areas are located at the impurity area formation areas.

A fifth manufacturing method relating to the present invention comprises: a first common process for forming an gate oxide film on a semiconductor substrate; a second common process for forming a gate electrode on the gate oxide film; a third common process for forming one impurity area and other impurity area at the surface of the semiconductor substrate, so that distances between the opposite ends of the gate oxide film and the impurity areas are corresponding to the non-offset structure; and an individual process for forming the offset structure by providing trenches on the boundary planes between the impurity areas and channel formation areas in accordance with quaternary writing data.

A sixth manufacturing method relating to the present invention comprises: a first common process for forming an gate oxide film on a semiconductor substrate; a second common process for forming a gate electrode on the gate oxide film; and an individual process for forming one impurity area and other impurity area at the surface of the semiconductor substrate, such that distance between these impurity areas and the opposite ends of the gate oxide film is set so as to form the offset structure or non-offset structure in accordance with quaternary writing data.

In the first through sixth manufacturing methods relating to the present invention, processes before data is written are implemented in common processes and data is written in an individual process. By the first through sixth manufacturing methods relating to the present invention, a non-volatile Read Only Memory with a short TAT, in which cells can be easily refined and data can be read with stability can be manufactured.

BRIEF DESCRIPTION OF THE DRAWINGS

Other objects and advantages of the present invention will be explained with reference to the following appended diagrams.

DESCRIPTION OF THE PREFERRED EMBODIMENTS

Aspects of the embodiment of the present invention will be explained below using the diagrams. In the diagrams, the sizes, shapes, and positional relationships of all components are shown in general term, and in only as much detail as needed to understand the present invention. In addition, the numeric conditions explained below are simply used as examples.

First Embodiment

A first aspect of the embodiment of the present invention where the present invention is applied in mask ROM, will be explained using FIGS. 1 through 3.

Figure 1:
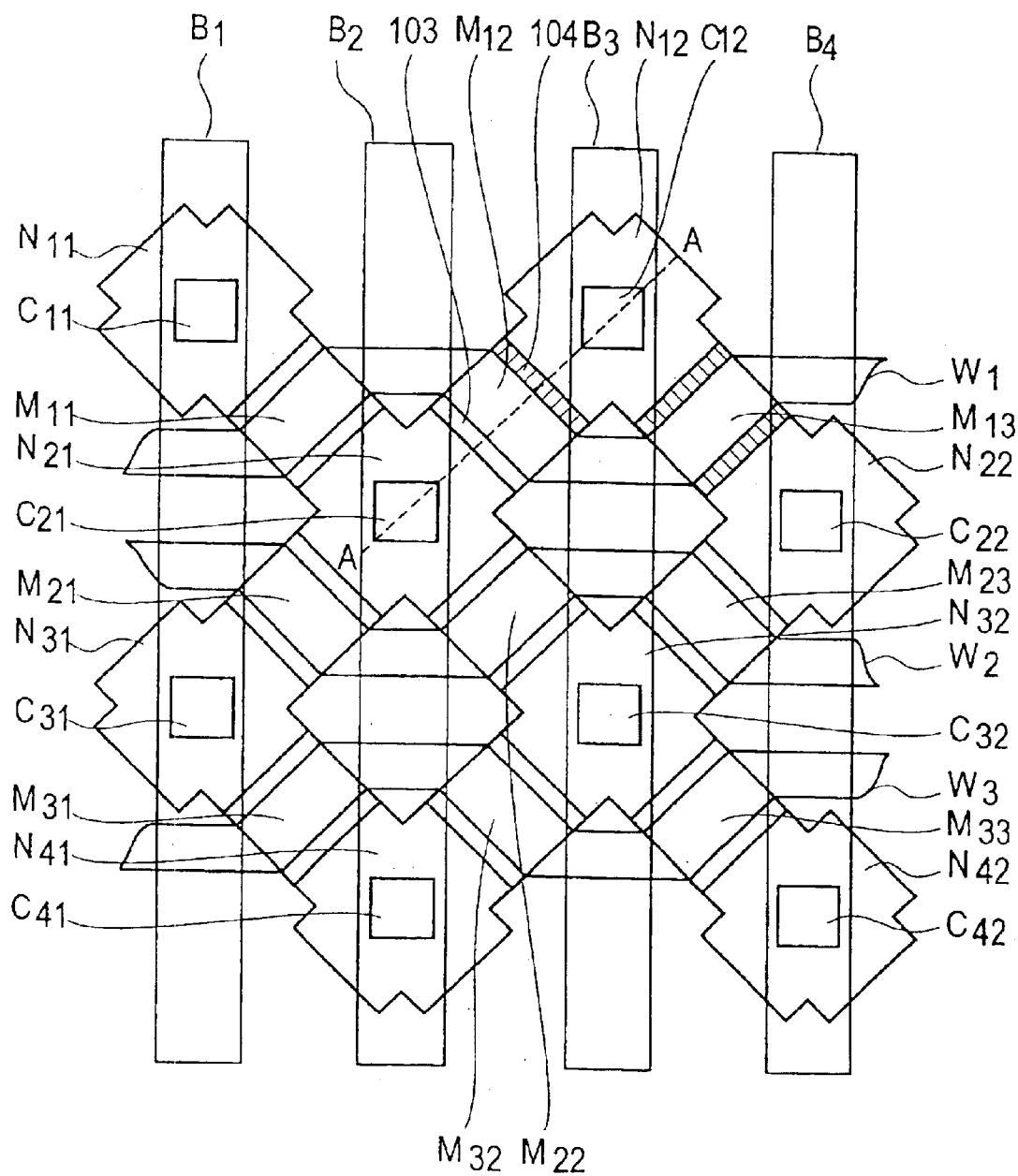
FIG. 1 is a plan view of the configuration of non-volatile Read Only Memory relating to a first aspect of the embodiment.

FIG. 1 is a plan view of the structure of mask ROM relating to this aspect of the embodiment. FIG. 2 is a cross-section at A—A in FIG. 1. FIG. 3 is a circuit diagram showing the configuration of mask ROM relating to this aspect of the embodiment n+ diffusion areas N11 through Nmn (only N11 through N42 are shown in FIG. 1) are formed on semiconductor substrate 101. As shown in FIG. 1, these n+ diffusion areas N11 through Nmn are arranged in the shape of the letter X. These n+ diffusion areas N11 through Nmn function as MOS transistor sources or drains n+ diffusion areas N11 through Nmn are each opposite four adjoining n+ diffusion areas, thus creating memory cell MOS transistors M11 through Mpq (only M11 through M33 are shown in FIGS. 1 and 3). For example, n+ diffusion area N21 in FIG. 1 is opposite N11, N12, N31, and N32, thus creating four memory cell transistors M11, M12, M21, and M22. Note however, that there are only one or two n+ diffusion areas next to any n+ diffusion area around a memory cell block and so only one or two MOS transistors are actually formed.

Figure 3:
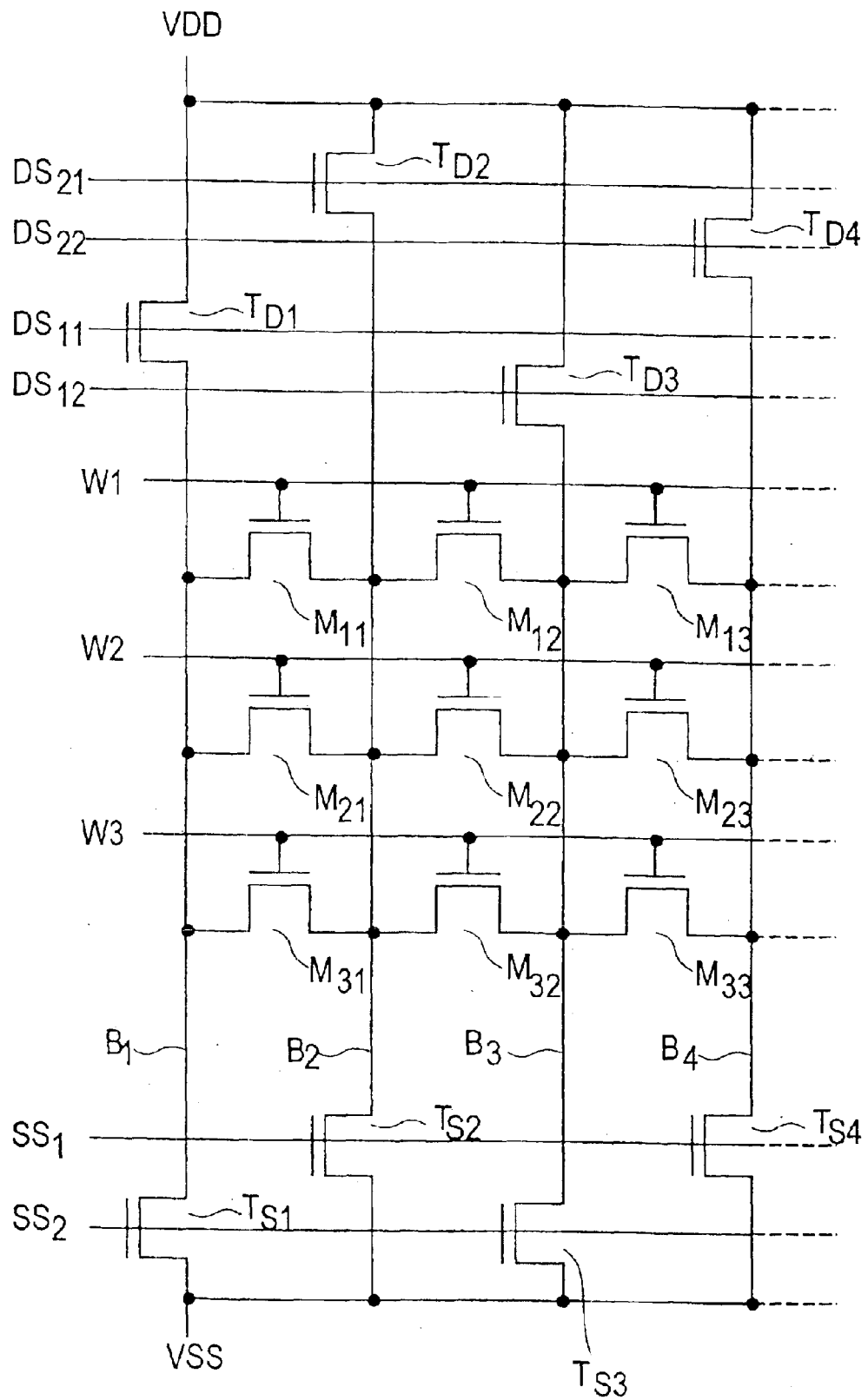
FIG. 3 is a circuit diagram showing the configuration of non-volatile Read Only Memory relating to a first aspect of the embodiment.

Word lines W1 through Wm (only W1 through W3 are shown in FIGS. 1 and 3) are formed through the gate insulation layer 102 on the surface of the semiconductor substrate 101. These word lines W1 through Wm function as gate electrodes for each MOS transistor. As explained above, n+ diffusion areas N11 through Nmn are arranged in the shape of the letter X and so word lines W11 through Wm are formed in the shape of the letter M.

Figure 2:
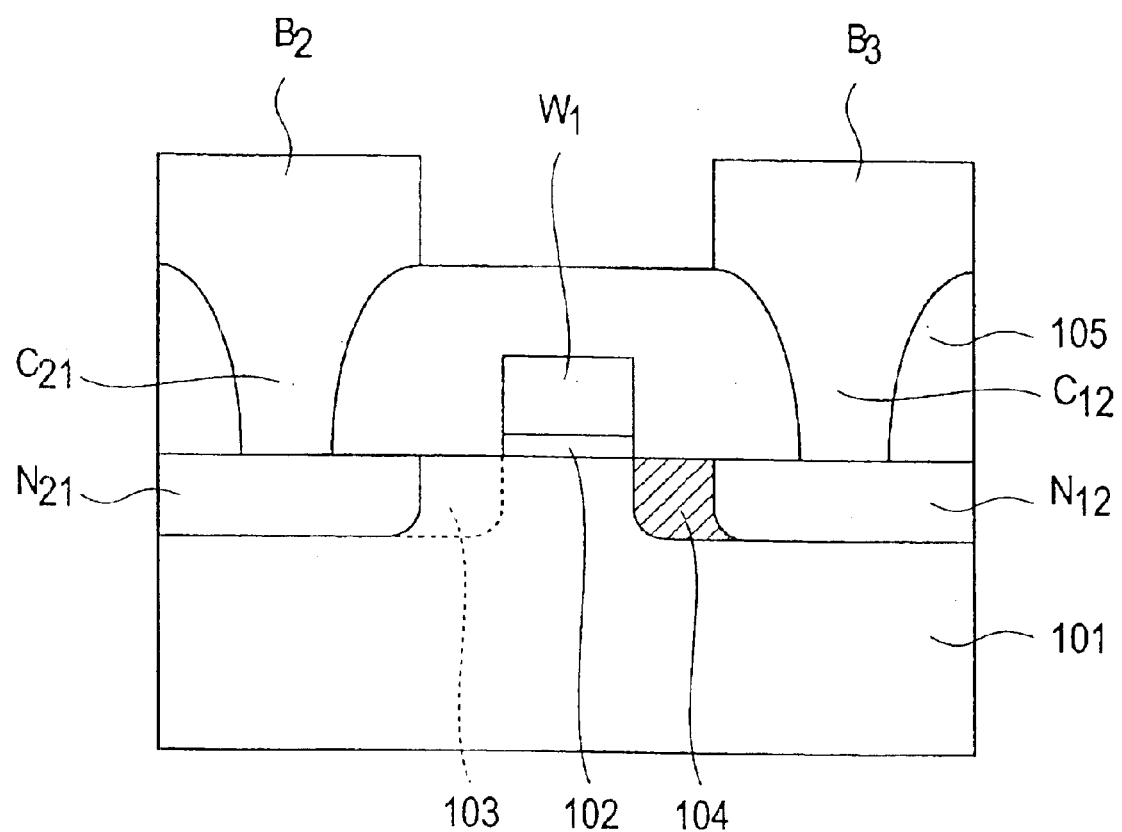
FIG. 2 is a cross-section at A—A on FIG. 1.

Gaps of at least the prescribed width are provided between a word line and two n+ diffusion areas in each memory cell transistor M11 through Mpq (see FIG. 2). These gap sections form the data writing areas 103 and 104. The widths of the data writing areas 103 and 104 are set to a value that can control the operation or non-operation of memory cell transistors by doping or not doping n+ impurities. In other words, if n+ impurities have not been doped into data writing area 103 but have been doped into data writing area 104 (see FIG. 2), when n+ diffusion area N12 is the source and n+ diffusion area N21 is the drain, an ON-current can be made to flow between n+ diffusion areas N12 and N21. However, when n+ diffusion area N12 is the drain and n+ diffusion area N21 is the source, an ON-current cannot be made to flow between the n+ diffusion areas N12 and N21. Conversely, if n+ impurities have been doped into data writing area 103 but have not been doped into data writing area 104, when n+ diffusion area N12 is the source and n+ diffusion area N21 is the drain, an ON-current cannot be made to flow between n+ diffusion areas N12 and N21. However, when n+ diffusion area N12 is the drain and n+ diffusion area N21 is the source, an ON-current can be made to flow between the n+ diffusion areas N12 and N21. In this aspect of the embodiment, the structure in which n+ impurities are not doped into a data writing area is called an "offset structure" and the structure in which n+ impurities are doped into a data writing area is called a "non-offset structure". In this aspect of the embodiment, an offset structure is obtained by setting appropriate gaps between the word lines W11 through Wm and n+ diffusion areas N11 through Nmn n+ impurities are doped into data writing areas 103 and 104 in accordance with the value of the written data (quaternary data). When n+ impurities are doped, the n+ diffusion area corresponding to this data writing area will become to an offset structure. In this aspect of the embodiment, the stored value when n+ impurities are doped into both data writing areas 103 and 104 is "11", the stored value when n+ impurities are doped into only data writing area 103 is "10", the stored value when n+ impurities are doped into only data writing area 104 is "01", and the stored value when n+ impurities are not doped into either data writing area 103 or 104 is "00". FIG. 2 shows an example in which impurities have been doped only into data writing area 104 on the n+ diffusion area N12 side.

An oxide insulating film 105 is formed on the surface of the semiconductor substrate 101. Furthermore, bit lines B1 through Bn (only B1 through B4 are shown in FIG. 1) are formed on the surface of the oxide insulation layer 105. These bit lines B1 through Bn are connected to each n+ diffusion area in the corresponding column via contact holes C11 through Cmn (only C11 through C42 are shown in FIG. 1).

As shown in FIG. 3, bit lines B1 through Bn are each connected to the source terminals of drain selection transistors TD1 through TDm (only TD1 through TD4 are shown in FIG. 3) and to the drain terminals of source selection transistors TS1 through TSm (only TS1 through TS4 are shown in FIG. 3). The drain terminals of drain selection transistors TD1 through TDm are each connected to the power source VDD (for example 5 volt). On the other hand, the source terminals of source selection transistors TS1 through TSm are each connected to the power source VSS (for example zero volts). Furthermore, the gate terminals of transistors TD1 through TDm are connected to either drain selection lines DS11 through DS1r or DS21 through DS2r (only DS11, DS12, DS21, and DS22 are shown in FIG. 3) and the gate terminals of transistors TS1 through TSm are connected to either source selection line SS1 or SS2.

Next, an example of the method by which data is written in the mask ROM of this aspect of the embodiment will be explained.

Firstly, as in the usual ROM manufacturing process, an gate oxide film 102, word lines W11 through Wm, and n+ diffusion areas N11 through Nmn are formed on a semiconductor substrate 101. The formation processes for these are implemented as common processes before data is written.

Next, n+ impurities are doped into the data writing area 103 or 104 that corresponds to write data. Usually, write data is determined by the program presented by the user. Impurities can be doped into data write areas 103 and 104 by implanting ions using a high-energy implantation apparatus. This ion implantation can also be implemented after the process in which the oxide insulating film 105 is formed (explained later).

Then, as in the usual ROM manufacturing process, the oxide insulating film 105, contact holes C11 through Cmn, and bit lines B1 through Bn are formed and the process ends.

Next, an example of a method for reading data in the mask ROM relating to this aspect of the embodiment will be explained for a case in which data is being read from memory cell M12.

Firstly, a high electric potential VDD is applied to word line W11. This causes word line W1 to be selected.

Next, by selecting the drain selection line DS21 and the source selection line SS2 (that is, by applying a high electric potential to these lines DS21 and SS2), transistors TD2 and TS3 are turned on. This causes a high electric potential VDD to be applied to bit line B2 and a low electric potential VSS to bit line B3. Accordingly, the n+ diffusion area N21 on the bit line B2 side becomes a drain and the n+ diffusion area N12 on the bit line B3 side becomes a source (see FIG. 2). In memory cell M12, the drain, that is the n+ diffusion area N21 side, has an offset structure (in other words a structure in which n+ impurities have not been doped in the data write area 103) but the source, that is the n+ diffusion area N12 side, has a non-offset structure. Now, the memory cell transistor M12 operates in a saturated area and so the depletion layer near the drain in the semiconductor substrate will reach from directly below the drain to the channel directly below the gate electrode via the data write area. Thus, even though the drain side has an offset structure, there is conductivity between the source and the drain. That is, the memory cell transistor M12 is turned on. Thus, the bit line B3 electric potential rises and so "1" is read from this bit line B3 as the low order bit in the quaternary data.

Next, selection lines DS21 and SS2 are returned to a non-selected state and transistors TD3 and TS2 are turned on by selecting drain selection line DS12 and source selection lines SS1. This causes a low electric potential VSS to be applied to bit line B2 and a high electric potential VDD to be applied to bit line B3. Accordingly, the n+ diffusion area N12 on the bit line B3 side becomes a drain and the n+ diffusion area N21 on the bit line B2 side becomes a source (see FIG. 2). This time, the source, that is the n+ diffusion area N21, has an offset structure and so, regardless of the structure of the drain n+ diffusion area N12, there is no conductivity between the source and the drain. That is, memory cell transistor M12 is turned off. This maintains the electric potential of bit line B2. Therefore, "0", for example, is read from this bit line B2 as the high order bit of quaternary data.

When n+ impurities are doped into both data write areas 103 and 104, a stored value of "11" can be read. When n+ impurities are doped only into data write area 103, a stored value of "10" can be read and when impurities are not doped into either data write area 103 or 104, a stored value of "00" can be read.

Thus, the on/off status of memory cell transistors in this aspect of the embodiment is determined by whether the source side has an offset or a non-offset structure. It is completely unrelated to the structure of the drain side.

As explained above, the mask ROM relating to this aspect of the embodiment can write quaternary data using the offset and non-offset structure of memory cell transistors. Quaternary data can then be read by reversing the n+ diffusion area source and drain and reading the information twice. Thus, this aspect of the embodiment is able to read data more reliably than mask ROM that stores differences in threshold values as quaternary data.

Also, in the mask ROM relating to this aspect of the embodiment, the formation of n+ diffusion areas N11 through Nmn can be implemented as common processes and thus TAT is reduced.

Furthermore, in the mask ROM of this aspect of the embodiment, impurities can only be doped in an area on the surface of which word lines W1 through Wm have not been formed. Therefore, impurities can be doped with stability and without being affected by word lines W1 through Wm.

Also, since an offset structure is one is physically visible, manufacture can be done while physically measuring the offset width, thus easily maintaining manufacturing stability.

In addition, in the mask ROM relating to this aspect of the embodiment, the conductivity of diffusion areas N11 through Nmn is the same as that of the doped impurities (n type in this aspect of the embodiment). Therefore, photoresistors can be formed easily when impurities are doped and cell sizes can be easily refined.

Furthermore, in the mask ROM relating to this aspect of the embodiment, memory cell transistors are arranged in the shape of the letter X and word lines formed in the shape of the letter M and therefore, wiring of sources and drains can be easily implemented using not the diffusion layer but metal wiring (bit lines B1 through Bn). Accordingly, the mask ROM relating to this aspect of the embodiment enables data to be read quickly and with stability.

Second Embodiment

A second aspect of the embodiment of the present invention, in which the present invention is applied in mask ROM, will be explained using FIGS. 4 and 5.

The circuit configuration for the mask ROM of this aspect of the embodiment is the same as for the first aspect of the embodiment (see FIG. 3) and so explanation of it will be omitted here.

Figure 4:
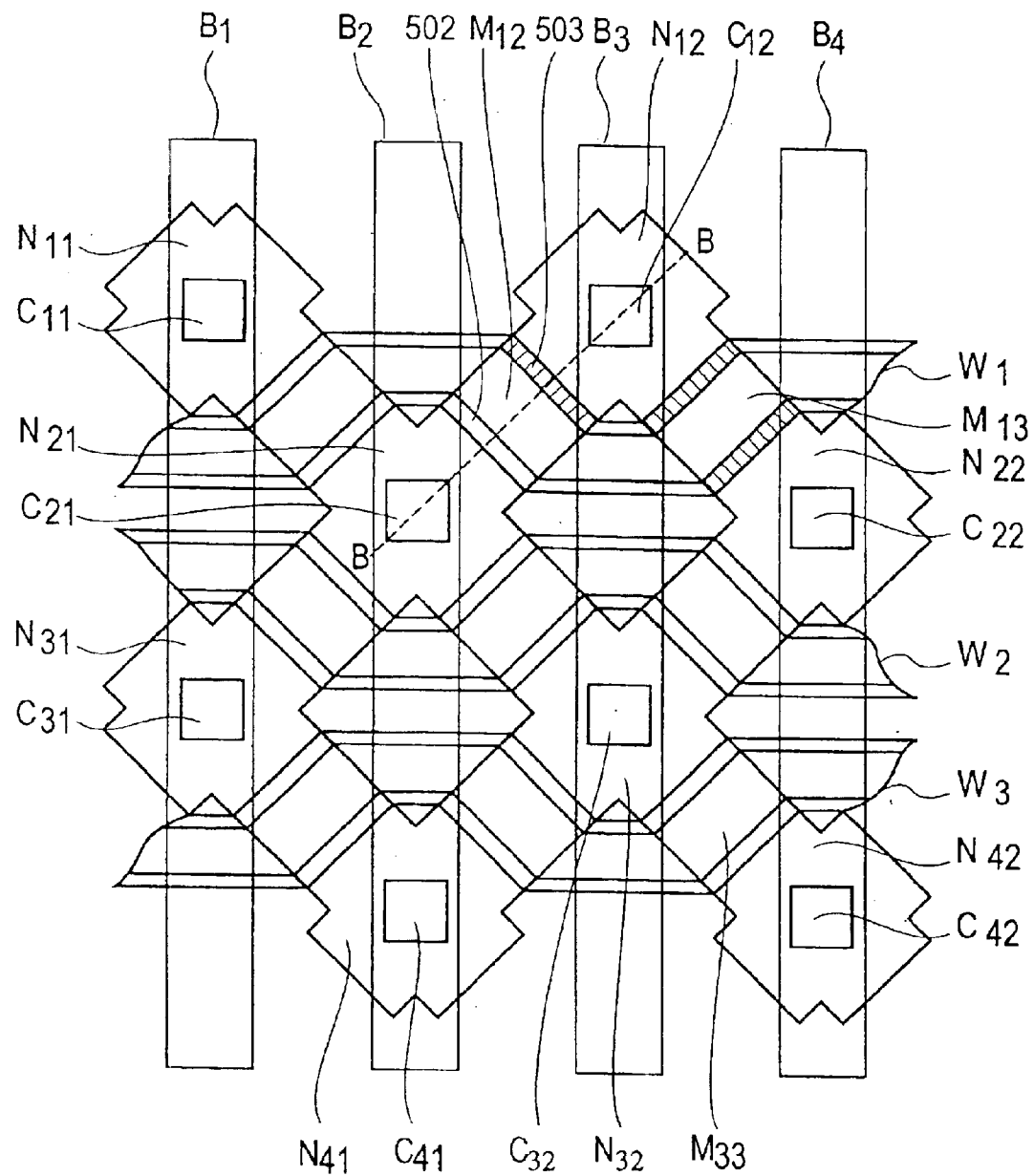
FIG. 4 is a plan view of the configuration of non-volatile Read Only Memory relating to a second aspect of the embodiment.

FIG. 4 is a plan view of the structure of mask ROM relating to this aspect of the embodiment. FIG. 5 is a cross-section at B—B on FIG. 4. In FIGS. 4 and 5, structural elements with the same codes as in FIGS. 1 and 2 are the same as those elements in FIGS. 1 and 2.

Figure 5:
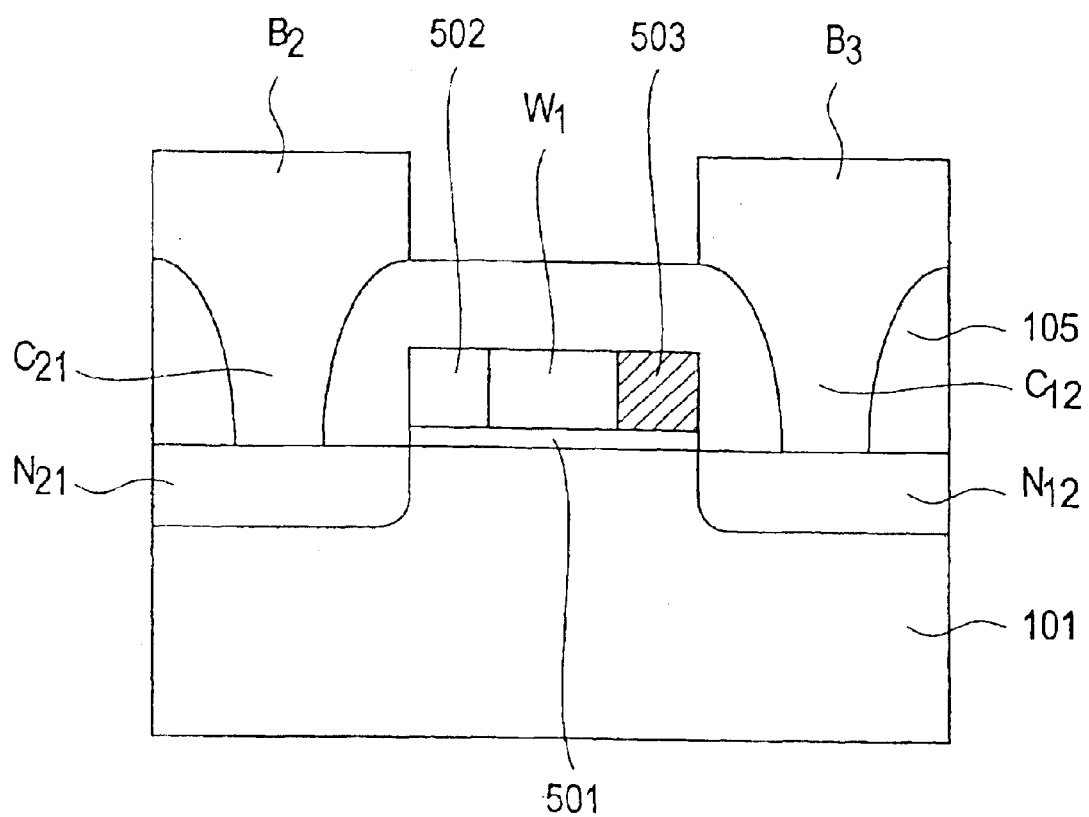
FIG. 5 is a cross-section at B—B on FIG. 4.

As shown in FIGS. 4 and 5, in the memory cell transistors used in this aspect of the embodiment, an gate oxide film 501 is formed over the entire surface of the non-diffusion area provided between the two n+ diffusion areas. Word lines W1 through Wm are formed so that they pass through the central section of this gate oxide film 501 and data write layers 502 and 503 are formed on the areas adjoining each of these n+ diffusion areas. The width of the data write layers 502 and 503 is set to a value that, in the case of that the data write areas 502 and 503 involved are non-conductive layers, the memory cell transistor involved can flow ON-current when the corresponding n+ diffusion area is used as a drain but the memory cell transistor cannot flow ON-current when the corresponding n+ diffusion area is used as a source. In other words, in the mask ROM relating to this aspect of the embodiment, an offset structure is obtained when the data write layers 502 and 503 are non-conductive.

Impurities are doped into data write layers 502 and 503 in accordance with the value of the write data (quaternary data). Material that can change this data write layer into a conductive layer are used as doped impurities. By doping impurities, the n+ diffusion area corresponding to the data write layer involved takes on a non-offset structure. In this aspect of the embodiment, the stored value when impurities are doped into both data write layers 502 and 503 is "11", the stored value when impurities are doped only into data write layer 502 is "10", the stored value when impurities are doped only into data write layer 503 is "01", and the stored value when impurities are not doped into either data write layers 502 or 503 is "00". FIG. 5 shows an example where impurities have been doped only into data write layer 503.

Next, an example of the method in which data is written in the mask ROM of this aspect of the embodiment will be explained.

Firstly, as in the normal ROM manufacturing process, an gate oxide film 501 and word lines W1 through Wm are formed on a semiconductor substrate 101. Furthermore, after non-conductive data write layers 502 and 503 are formed along both sides of word lines W1 through Wm using deposition technology, such as chemical vapor deposition (CVD), n+ diffusion areas N11 through Nmn are formed using impurities doping technology such as ion implantation. These formation processes are implemented as common processes before data is written.

Next, impurities are doped into the data write layers 502 and/or 503 in accordance with the written data. The impurities can be doped, for example, by ion implantation using a high-energy implantation apparatus.

As in the normal ROM manufacturing process, the oxide insulating film 105, contact holes C11 through Cmn, and bit lines B1 and Bn are then formed and the process ends.

Next, the method of writing data in the mask ROM relating to this aspect of the embodiment will be explained for a case in which data is read from a the memory cell M12.

Firstly, by applying a high electric potential VDD to a word line W1 (see FIG. 3), this word line W1 is selected.

Next, transistors TD2 and TS3 are turned on by selecting drain selection line DS21 and source selection line SS2. This causes a high electric potential VDD to be applied to bit line B2 and a low electric potential VSS to bit line B3. Accordingly, the n+ diffusion area N21 on the bit line B2 side becomes a drain and the n+ diffusion area N12 on the bit line B3 side becomes a source (see FIG. 5). Here, the n+ diffusion area N21 in memory cell M12 has an offset structure (in other words the data write layer 502 is non-conductive). As a result, when this n+ diffusion area N21 is used as a drain, the memory cell transistor M12 is turned on. Therefore, the electric potential of bit line B3 rises and "1" is read as the low order bit of quaternary data from this bit line B3.

Next, transistors TD3 and TS2 are turned on by selecting drain selection line DS12 and source selection line SS1. This causes a low electric potential VSS to be applied to bit line B2 and a high electric potential VDD to bit line B3. Accordingly, the n+ diffusion area N12 on the bit line B3 side becomes a drain and the n+ diffusion area N21 on the bit line B2 side becomes a source (see FIG. 5). Here, the n+ diffusion area N21 in memory cell M12 has an offset structure (in other words the data write layer 502 is non-conductive). As a result, when this n+ diffusion area N21 is used as a source, the memory cell transistor M12 is not turned on. Therefore, the electric potential of bit line B2 does not rise and "0" is read as the high order bit of quaternary data from this bit line B2.

In the same way, when both data write layers 502 and 503 are conductive, the stored value "11" can be read, when only the data write layer 502 is conductive the stored value "10" can be read, and when both data write layers 502 and 503 are non-conductive, stored value "00" can be read.

As explained above, when the mask ROM relating to this aspect of the embodiment is used, quaternary data can be written using the offset/non-offset structure of memory cell transistors. Also, quaternary data can be read by reversing the n+ diffusion area source and drain and reading information twice. Therefore, this aspect of the embodiment enables more reliable data reading than is possible using mask ROM that stores the differences in threshold values as quaternary data.

Also, in the mask ROM relating to this aspect of the embodiment, the formation of n+ diffusion areas N11 through Nmn can be implemented as a common process and therefore TAT can be reduced.

Furthermore, in the mask ROM relating to this aspect of the embodiment, data is written by making areas adjoining word lines W1 through Wm (data write layers 502 and 503) conductive. Therefore, the effect of the upper layer substance is negligible and data can be written by stable ion implantation. It is also easy to form photo resistors when impurities are doped and refinement of cell sizes is simple. In addition, the structure is a physical offset structure and thus non-conductive current control can be manufactured in a stable manner while physically measuring the visible offset width.

In the mask ROM relating to this aspect of the embodiment, memory cell transistors are arranged in the shape of the letter X and word lines are formed in the shape of the letter M. Therefore, the source and drain wiring can be implemented easily not with the diffusion layer but with metal lines (bit lines B1 through Bn). Accordingly, fast and stable data reading is enabled.

Third Embodiment

A third aspect of the embodiment of the present invention, in which the present invention is applied in mask ROM, will be explained using FIGS. 6 and 7.

The circuit configuration for the mask ROM of this aspect of the embodiment is the same as for the first aspect of the embodiment (see FIG. 3) and so explanation of it will be omitted here.

Figure 6:
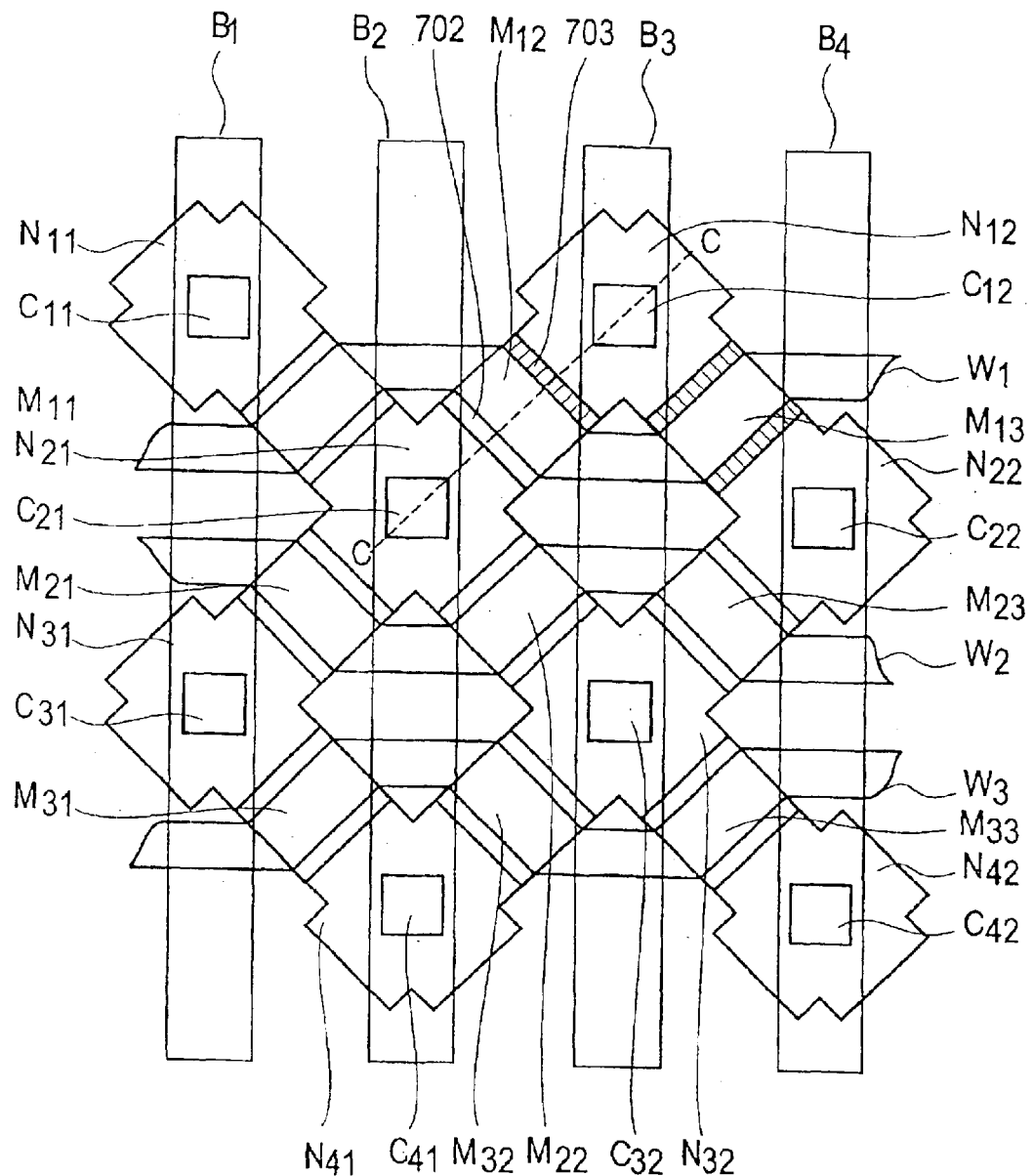
FIG. 6 is a plan view of the configuration of non-volatile Read Only Memory relating to a third aspect of the embodiment.

FIG. 6 is a plan view of the structure of a mask ROM relating to this aspect of the embodiment. FIG. 7 is a cross-section at C—C in FIG. 6. In FIGS. 6 and 7, structural elements with the same codes as in FIGS. 1 and 2 are the same as those elements in FIGS. 1 and 2.

Figure 7:
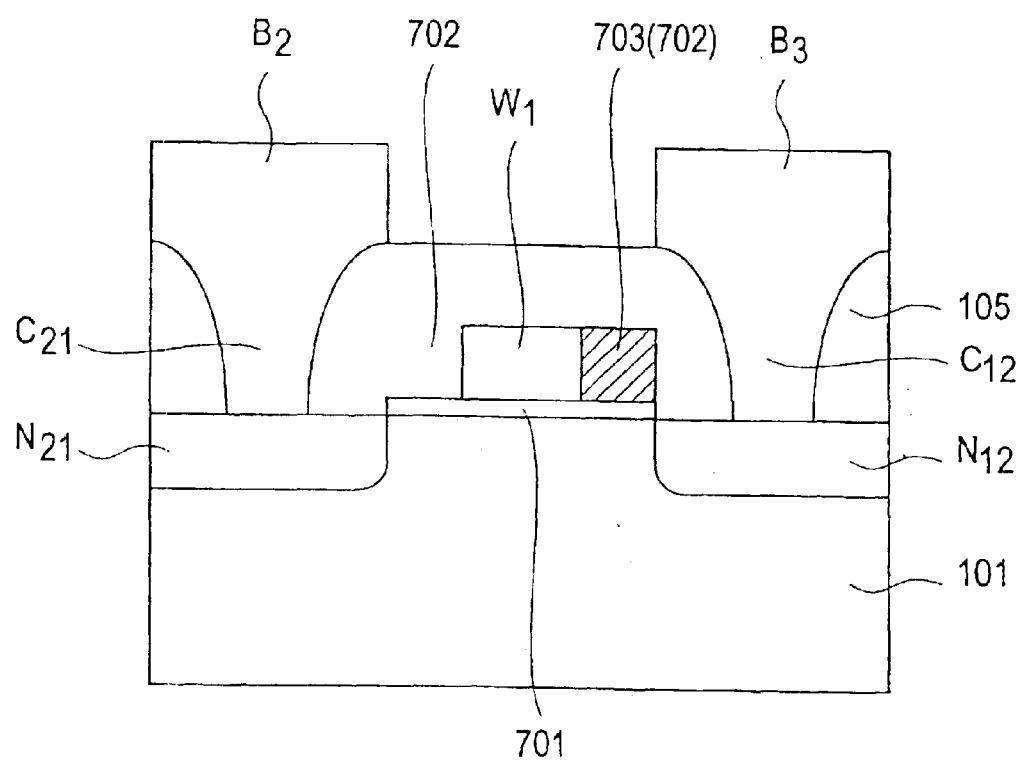
FIG. 7 is a cross-section at C—C in FIG. 6.

As shown in FIGS. 6 and 7, in the memory cell transistors used in this aspect of the embodiment, an gate oxide film 701 is formed over the entire surface of the non-diffusion area provided between the two n+ diffusion areas. Word lines W1 through Wm are also formed so that they pass through the central section of this gate oxide film 701. Gaps 702 of at least the prescribed width are provided between the word lines and two n+ diffusion areas. The width of these gaps 702 is set to a value that enables a current to flow between the n+ diffusion areas for the relevant transistor when this n+ diffusion area is used as a drain, but that disables a current to flow when this n+ diffusion area is used as a sources. In other words, in the mask ROM relating to this aspect of the embodiment, an offset structure is achieved by providing gaps 702 between the word lines and the n+ diffusion areas.

Gate electrodes 703 for storing data are formed in the gaps 702 in accordance with the value of the write data (quaternary data). When the memory cell transistors are operating, these gate electrodes 703 for storing data act as gate electrodes together with word lines W11 through Wm. By providing gate electrodes 703 for storing data, the n+ diffusion areas corresponding to these gate electrodes 703 for storing data take on a non-offset structure. In this aspect of the embodiment, the stored value when gate electrodes 703 for storing data are formed in both gaps 702 is "11", the stored value when a gate electrode 703 for storing data is formed only in gap 702 on the N21 side is "10", the stored value when a gate electrode 703 for storing data is formed only in gap 702 on the N12 side is "01", and the stored value when a gate electrode 703 for storing data is not formed in either gap 702 is "00". FIG. 7 shows an example in which a gate electrode 703 for storing data is formed only in the gap 702 on the n+ diffusion area N12 side.

An example of the method used to write data in the mask ROM relating to this aspect of the embodiment will now be explained.

Firstly, as in the normal ROM manufacturing process, an gate oxide film 701, word lines W1 through Wm, and n+ diffusion areas N11 through Nmn are formed on a semiconductor substrate 101. These formation processes are implemented as common processes before data is written.

Next, gate electrodes 703 for storing data are formed in those sections of each gap 702 that correspond to write data. The gate electrodes 703 for storing data can be formed, for example, using deposition technology such as CVD.

As in the normal ROM manufacturing process, an oxide insulation film 105, contact holes C11 through Cmn, and bit lines B1 through Bn are formed and the process ends.

An example of the method used to read data in the mask ROM relating to this aspect of the embodiment will be explained for a case where data is read from memory cell M12.

Firstly, by applying a high electric potential VDD onto a word line W11 (see FIG. 3), this world line W11 is selected. Here, a high electric potential VDD is also applied to each gate electrode 703 for storing data.

Next, transistors TD2 and TS3 are turned on by selecting the drain selection line DS21 and the source selection line SS2. This causes a high electric potential VDD to be applied to bit line B2 and a low electric potential VSS to be applied to bit line B3. Accordingly, the n+ diffusion area N21 on the bit line B2 side becomes a drain and the n+ diffusion area N12 on the bit line B3 side becomes a source (see FIG. 7). Here, in memory cell M12, the n+ diffusion area N21 has an offset structure (in other words no gate electrode for storing data is formed) and so when n+ diffusion area N21 is used as a drain, a current flows between n+ diffusion areas N12 and N21. Therefore, the electric potential of bit line B3 rises. This means that "1" is read as the low order bit of quaternary data from this bit line B3.

Next, transistors TD3 and TS2 are turned on by selecting the drain selection line DS12 and the source selection line SS1. This causes a low electric potential VSS to be applied to bit line B2 and a high electric potential VDD to be applied to bit line B3. Accordingly, the n+ diffusion area N12 on the bit line B3 side becomes a drain and the n+ diffusion area N21 on the bit line B2 side becomes a source (see FIG. 7). Here, in memory cell M12, the n+ diffusion area N21 has an offset structure (in other words no gate electrode 703 for storing data is formed) and so when n+ diffusion area N21 is used as a source, the memory cell transistor M12 is not turned on. Therefore, the electric potential of bit line B2 does not rise. This means that "0" is read as the high order bit of quaternary data from this bit line B2.

Likewise, stored value "11" can be read when gate electrodes 703 for storing data are formed in both gaps 702, stored value "10" can be read when a gate electrode 703 for storing data is formed only in gap 702 on the n+ diffusion area N21 side, and stored value "00" can be read when a gate electrode 703 for storing data is not formed in either gap 702.

As explained above, the mask ROM relating to this aspect of the embodiment enables quaternary data to be written using the offset/non-offset structure of the memory cell transistors. The quaternary data can also be read by reversing the n+ diffusion area source and drain and reading information twice. Therefore, this aspect of the embodiment enables data to be read with much greater reliability than the mask ROM that stores differences in threshold values as quaternary data.

Also, in the mask ROM relating to this aspect of the embodiment, the formation of n+ diffusion areas N11 through Nmn can be implemented as a common process and so TAT is reduced.

Furthermore, in the mask ROM relating to this aspect of the embodiment, data can be written by forming a second gate that makes contact with a gate electrode on the word line. Therefore, a current can be controlled by physically measuring the offset width during manufacture. Accordingly, manufacturing stability is better than when data is written using ion implantation. In addition, photo resistors for offset width and data writing can be easily created and cell sizes easily refined.

In the mask ROM relating to this aspect of the embodiment, memory cell transistors are arranged in the shape of the letter X and word lines in the shape of the letter M and so, source and drain wiring can be easily implemented not using the diffusion layer but using metal lines (bit lines B1 through Bn). Accordingly, it is easy for data to be read quickly and with stability.

Fourth Embodiment

A fourth aspect of the embodiment of the present invention, in which the present invention is applied in mask ROM, will be explained using FIGS. 8 and 9.

The circuit configuration for the mask ROM of this aspect of the embodiment is the same as for the first aspect of the embodiment (see FIG. 3) and so explanation of it will be omitted here.

Figure 8:
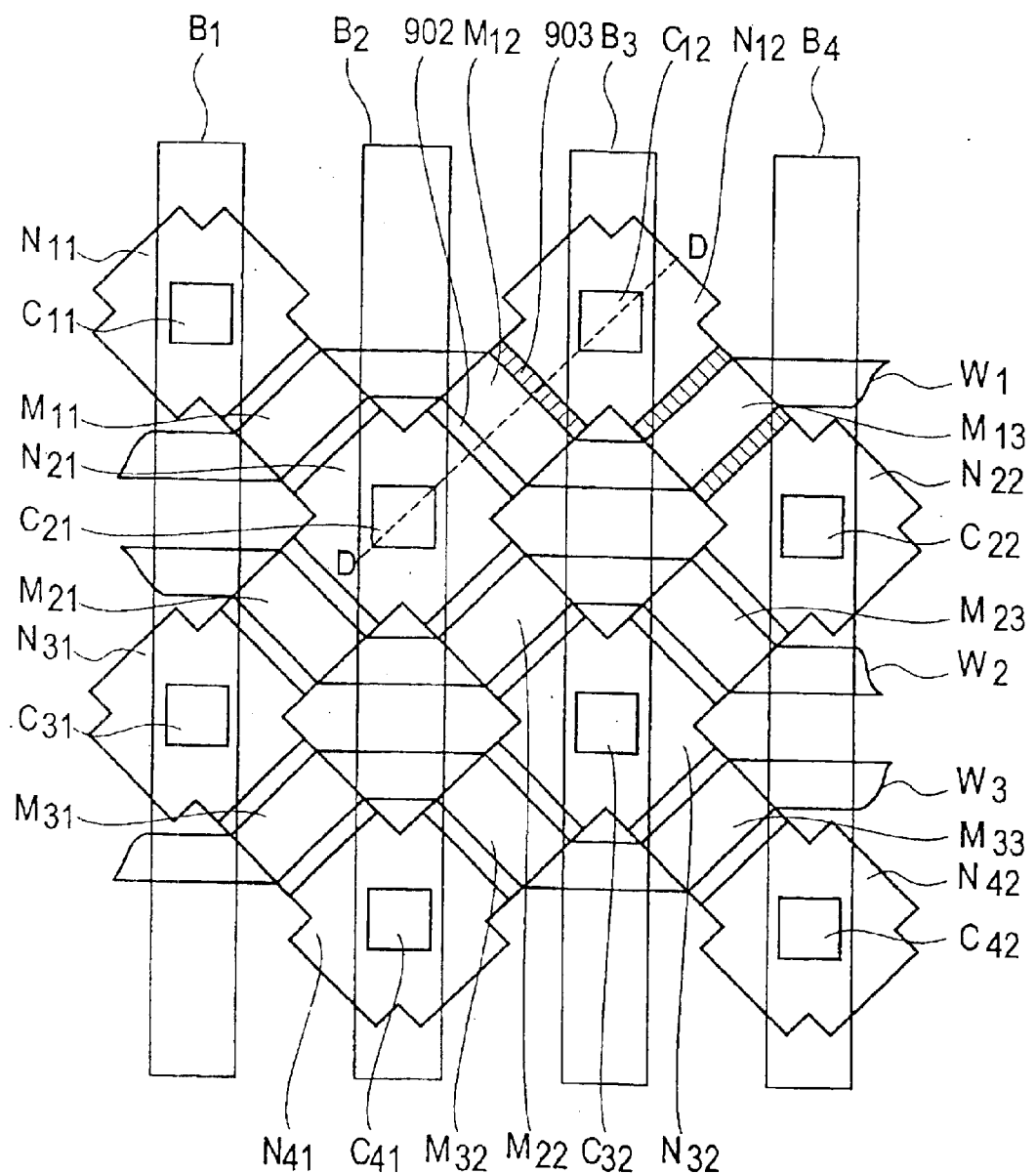
FIG. 8 is a plan view of the configuration of non-volatile Read Only Memory relating to a fourth aspect of the embodiment.

FIG. 8 is a plan view of the structure of a mask ROM relating to this aspect of the embodiment. FIG. 9 is a cross-section at D—D in FIG. 8. In FIGS. 8 and 9, structural elements with the same codes as in FIGS. 1 and 2 are the same as those elements in FIGS. 1 and 2.

Figure 9:
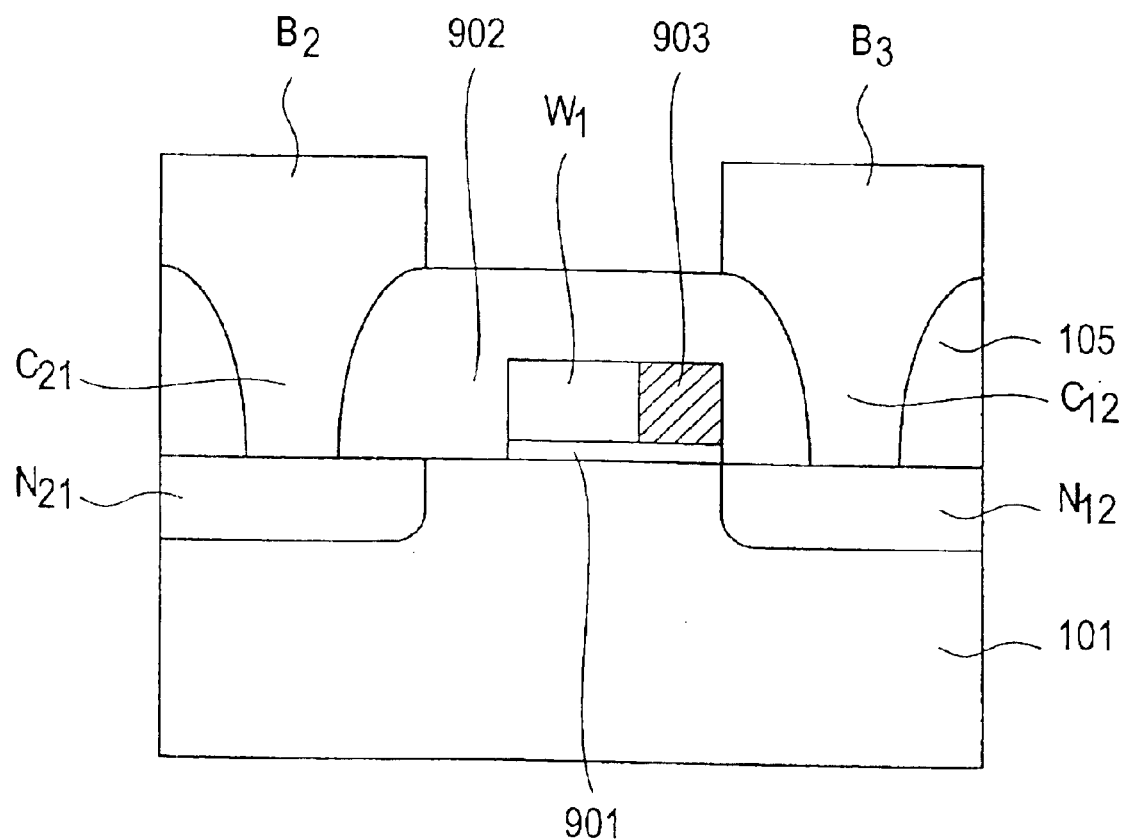
FIG. 9 is a cross-section at D—D in FIG. 8.

As shown in FIGS. 8 and 9, in the memory cell transistors used in this aspect of the embodiment, an gate oxide film 901 is formed between the two n+ diffusion areas. Word lines W1 through Wm are also formed so that they pass through this gate oxide film 901.

In this aspect of the embodiment, the way in which the word lines W11 through Wm are made is prescribed according to the value of the write data (quaternary data).

In the example in FIG. 9, the gate length of word line W11 is set short for the n+ diffusion area N21 side and a gap 902 is formed. The width of this gap 902 is set to a value that enables a current to flow between n+ diffusion areas N12 and N21 when this n+ diffusion area N21 is used as a drain and that disables that a current to flow between n+ diffusion areas N12 and N21 when this n+ diffusion area N21 is used as a source. In other words, in this mask ROM, an offset structure is obtained by setting a short gate length for word line W11 on the n+ diffusion area N21 side.

Also, this word line W11 is formed close to n+ diffusion area N12. In other words, the gate length of word line W11 is increased on the n+ diffusion area N12 side just enough to cater for area 903. The longer gate length setting gives the n+ diffusion area N12 a non-offset structure.

In this aspect of the embodiment, the stored value when the gate length of the word line is longer as it approaches both n+ diffusion areas N21 and N12 is "11", the stored value when it is longer only as it approaches n+ diffusion area N21 is "10", the stored value when it is longer only as it approaches n+ diffusion area N12 is "01", and the stored value when it is shorter as it approaches both n+ diffusion areas N21 and N12 is "00".

Next, an example of the method used to write data in the mask ROM according to this aspect of the embodiment will be explained.

Firstly, using the usual deposition technology, an gate oxide film 901 and word lines W1 through Wm (including area 903) are formed in accordance with the value of the write data. Furthermore, n+ diffusion areas N11 through Nmn are formed using the usual impurities doping technology.

Then, as in the usual ROM manufacturing process, an oxide insulation film 105, contact holes C11 through Cmn, and bit lines B1 through Bn are formed and the process end.

An example of the method used to read data in the mask ROM relating to this aspect of the embodiment will be explained for a case in which data is read from memory cell M12.

Firstly, by applying a high electric potential VDD to word line W1 (see FIG. 3), this word line W11 is selected.

Next, transistors TD2 and TS3 are turned on by selecting the drain selection line DS21 and the source selection line SS2. This causes a high electric potential VDD to be applied to bit line B2 and a low electric potential VSS to be applied to bit line B3. Accordingly, the n+ diffusion area N21 on the bit line B2 side becomes a drain and the n+ diffusion area N12 on the bit line B3 side becomes a source (see FIG. 9). Here, in memory cell M12, the n+ diffusion area N21 takes on an offset structure (in other words the gate length of word line W11 is short) and so when this n+ diffusion area N21 is used as a drain, a current flows between n+ diffusion areas N12 and N21. Therefore, the electric potential of bit line B3 rises. This means that "1" is read as the low order bit of quaternary data from this bit line B3.

Next, transistors TD3 and TS2 are turned on by selecting the drain selection line DS12 and the source selection line SS1. This causes a low electric potential VSS to be applied to bit line B2 and a high electric potential VDD to be applied to bit line B3. Accordingly, the n+ diffusion area N12 on the bit line B3 side becomes a drain and the n+ diffusion area N21 on the bit line B2 side becomes a source (see FIG. 9). Here, in memory cell M12, the n+ diffusion area N21 takes on an offset structure (in other words the gate length of word line W11 is long) and so when n+ diffusion area N21 is used as a source, no current flows between n+ diffusion areas N12 and N21. Therefore, the electric potential of bit line B2 does not rise. This means that "0" is read as the high order bit of quaternary data from this bit line B2.

Likewise, the stored value "11" can be read when the gate length of the word line is long on both sides, the stored value "10" can be read when the gate length of the word line is long only on the n+ diffusion area N21 side, and the stored value "00" can be read when the gate length of the word line is short on both sides.

As explained above, the mask ROM relating to this aspect of the embodiment can be used to write quaternary data using the offset/non-offset structure of the memory cell transistors. Quaternary data can also be read by reversing the n+ diffusion area source and drain and reading information twice. Therefore, this aspect of the embodiment can be used to read data with more reliability than the mask ROM that stores differences in threshold values as quaternary data.

Also, in the mask ROM relating to this aspect of the embodiment, because data can be written using the gate length of word lines, data can be read with stability, photo resistors can be formed simply, and cell sizes can be easily refined.

In addition, in the mask ROM relating to this aspect of the embodiment, memory cell transistors are arranged in the shape of the letter X and word lines are formed in the shape of the letter M and so source and drain wiring can be easily implemented using not the diffusion layer but metal lines (bit lines B1 through Bn). Accordingly, fast and stable data reading is enabled through the use of the mask ROM relating to this aspect of the embodiment Fifth Embodiment A fifth aspect of the embodiment of the present invention, in which the present invention is applied in mask ROM, will be explained using FIGS. 10 and 11.

The circuit configuration for the mask ROM of this aspect of the embodiment is the same as for the first aspect of the embodiment (see FIG. 3) and so explanation of it will be omitted here.

Figure 10:
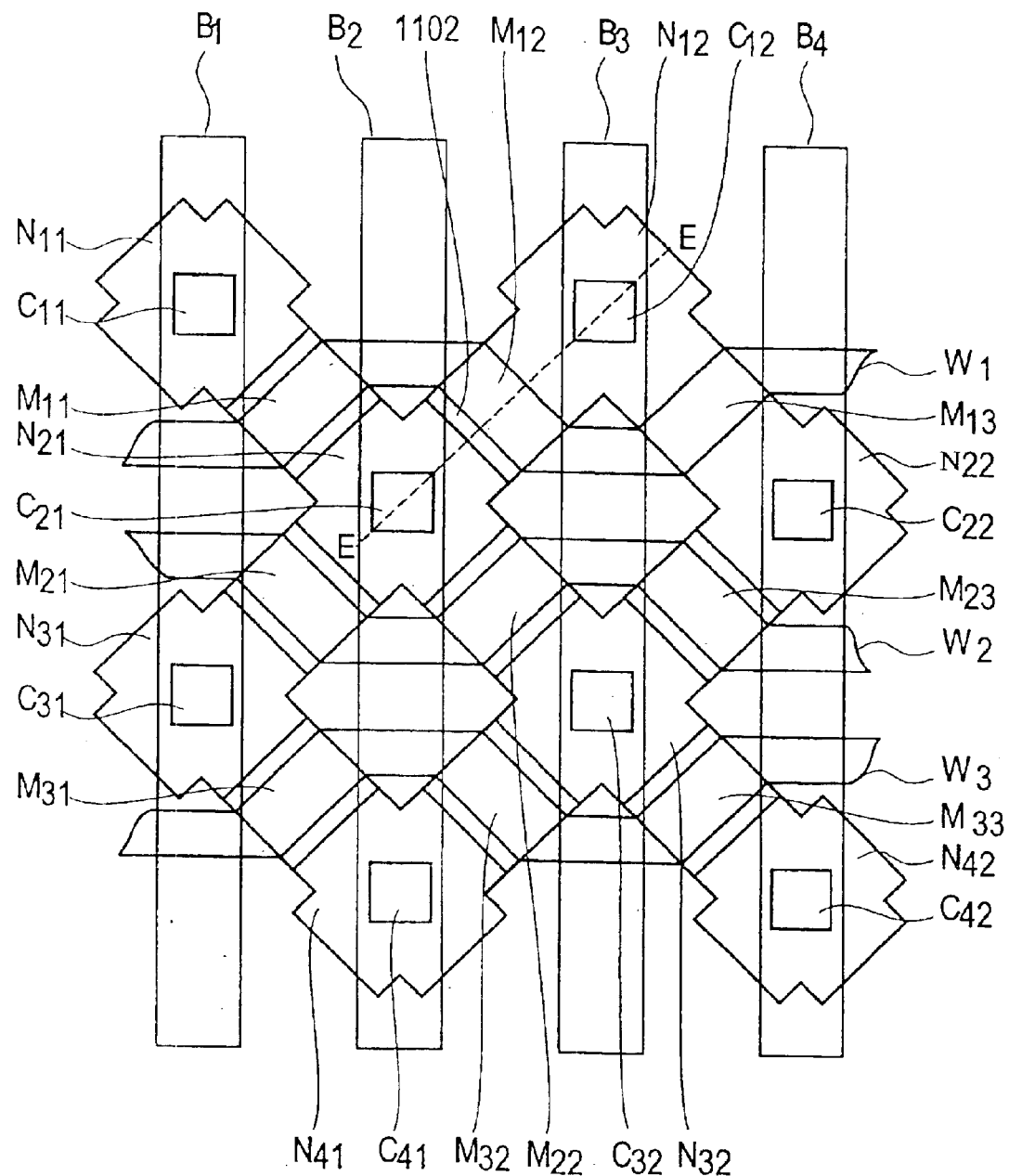
FIG. 10 is a plan view of the configuration of non-volatile Read Only Memory relating to a fifth aspect of the embodiment.
Figure 11:
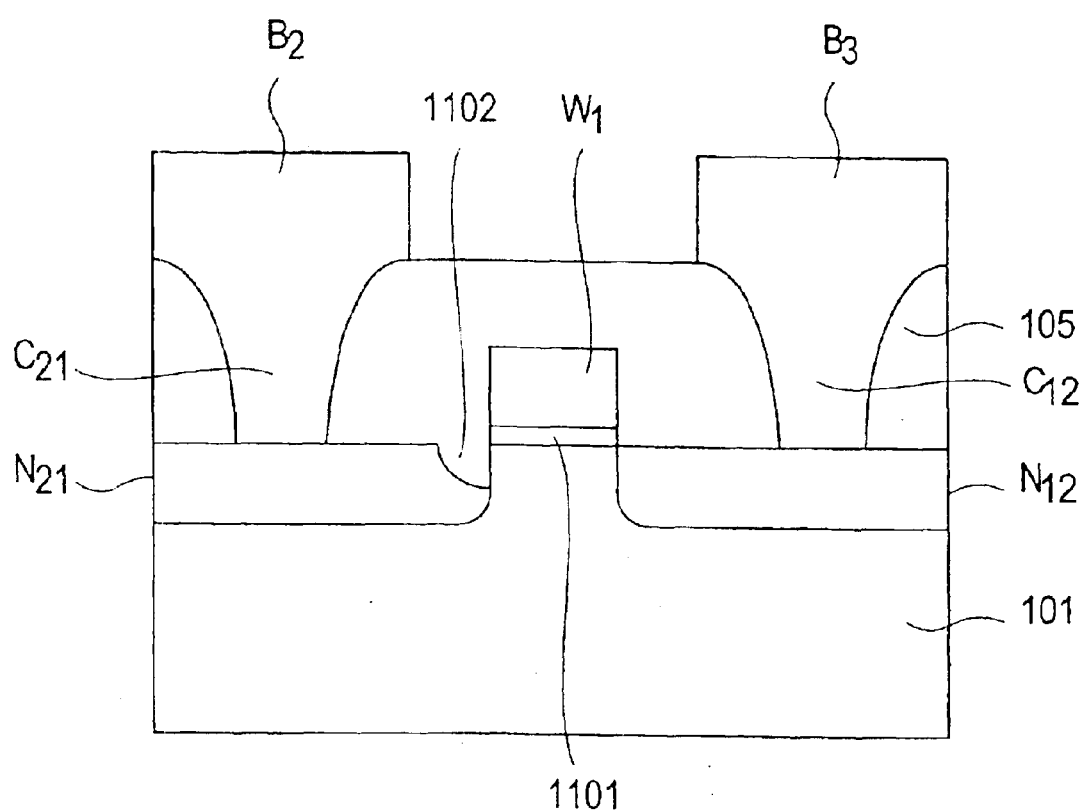
FIG. 11 is a cross-section at E—E in FIG. 10.

FIG. 10 is a plan view of the structure of a mask ROM relating to this aspect of the embodiment. FIG. 11 is a cross-section at E—E in FIG. 10. In FIGS. 10 and 11, structural elements with the same codes as in FIGS. 1 and 2 are the same as those elements in FIGS. 1 and 2.

As shown in FIGS. 10 and 11, in the memory cell transistors used in this aspect of the embodiment, an gate oxide film 1101 is formed over the entire surface of the non-diffusion area provided between the two n+ diffusion areas. Word lines W1 through Wm are formed throughout the whole area on this oxide gate film 1101.

In this aspect of the embodiment, a trench 1102 is formed near the plane where an n+ diffusion area forms a boundary with the non-diffusion area (area under gate oxide film 1101) in accordance with the value of the write data (quaternary data).

In the example shown in FIG. 11, a trench 1102 is formed in the n+ diffusion area N21. The depth of this trench 1102 is set to a value that enables a current to flow in n+ diffusion areas N12 and N21 when this n+ diffusion area N21 is used as a drain but that disables a current to flow in n+ diffusion areas N12 and N21 when n+ diffusion area N21 is used as a source. In other words, in this mask ROM, formation of a trench 1102 enables an offset structure to be achieved.

Also, a trench is not formed in n+ diffusion area N12 and so this takes on an non-offset structure.

In this aspect of the present embodiment, the stored value when trenches 1102 are formed in both n+ diffusion areas N21 and N12 is "11", the stored value when a trench 1102 is formed only in n+ diffusion area N12 is "10", the stored value when a trench 1102 is formed only in n+ diffusion area N21 is "01", and the stored value when a trench 1102 is not formed in either n+ diffusion area N21 or N12 is "00".

Next, an example of the method for writing data in the mask ROM of this aspect of the embodiment will be explained.

In this mask ROM, as with in usual ROM manufacturing process, an gate oxide film 1101, word lines W11 through Wm, and n+ diffusion areas N11 through Nmn are formed on a semiconductor substrate 101. These formation processes are implemented as common processes before data is written.

Next, trenches 1102 are formed on those n+ diffusion areas N11 through Nmn that correspond to the write data. Trenches 1102 are formed, for example, by etching.

Then, as in the usual ROM manufacture process, an oxide insulation film 105, contact holes C11 through Cmn, and bit lines B1 through Bn are formed and the process end.

Next, an example of a method used for reading data in mask ROM relating to this aspect of the embodiment will be explained for a case in which data is read from a memory cell M12.

Firstly, by applying a high electric potential VDD to word line W1 (see FIG. 3), this word line W11 is selected.

Next, transistors TD2 and TS3 are turned on by selecting the drain selection line DS21 and the source selection line SS2. This causes a high electric potential VDD to be applied to bit line B2 and a low electric potential VSS to be applied to bit line B3. Accordingly, the n+ diffusion area N21 on the bit line B2 side becomes a drain and the n+ diffusion area N12 on the bit line B3 side becomes a source (see FIG. 11). In memory cell M12, the n+ diffusion area N21 takes on an offset structure (in other words a trench 1102 is formed) and so when n+ diffusion area N21 is used as a drain, memory cell transistor M12 is turned on. Therefore, the electric potential of bit line B3 rises. This means that "1" is read as the low order bit of quaternary data from this bit line B3.

Next, transistors TD3 and TS2 are turned on by selecting the drain selection line DS12 and the source selection line SS1. This causes a low electric potential VSS to be applied to bit line B2 and a high electric potential VDD to be applied to bit line B3. Accordingly, the n+ diffusion area N12 on the bit line B3 side becomes a drain and the n+ diffusion area N21 on the bit line B2 side becomes a source (see FIG. 11). In memory cell M12, the n+ diffusion area N21 takes on an offset structure (in other words a trench 1102 is formed) and so when n+ diffusion area N21 is used as a source, the memory cell transistor M12 is not turned on. Therefore, the electric potential of bit line B2 does not rise. This means that "0" is read as the high order bit of quaternary data from this bit line B2.

Likewise, stored value "11" can be read when trench 1102 is not formed in either n+ diffusion areas N21 or N12, stored value "10" can be read when a trench 1102 is formed only in n+ diffusion area N12, and stored value "00" can be read when a trenches 1102 are formed in both n+ diffusion area N21 and N12.

As explained above, the mask ROM relating to this aspect of the embodiment enables quaternary data to be written using the offset/non-offset structure of the memory cell transistors. The quaternary data can also be read by reversing the n+ diffusion area source and drain and reading information twice. Therefore, this aspect of the embodiment can read data with greater reliability than the mask ROM that stores differences in threshold values as quaternary data.

Also, in the mask ROM relating to this aspect of the embodiment, the formation of n+ diffusion areas N11 through Nmn can be implemented as common processes and so TAT is reduced.

Furthermore, in the mask ROM relating to this aspect of the embodiment, data can be written using trenches. Accordingly, manufacture can occur while physically measuring trench dimensions. Therefore, data can be written with more stability than when data is written using ion implantation. Thus, photo resistors can be easily created and cell sizes easily refined.

In addition, in the mask ROM relating to this aspect of the embodiment, memory cell transistors are arranged in the shape of the letter X and word lines are formed in the shape of the letter M and so source and drain wiring can be implemented easily using not the diffusion layer but metal lines (bit lines B1 through Bn). Accordingly, fast an stable data reading is enabled through the use of the mask ROM relating to this aspect of the embodiment.

Sixth Embodiment

A sixth aspect of the embodiment of the present invention, in which the present invention is applied in mask ROM, will be explained using FIGS. 12 and 13.

The circuit configuration for the mask ROM of this aspect of the embodiment is the same as for the first aspect of the embodiment (see FIG. 3) and so explanation of it will be omitted here.

Figure 12:
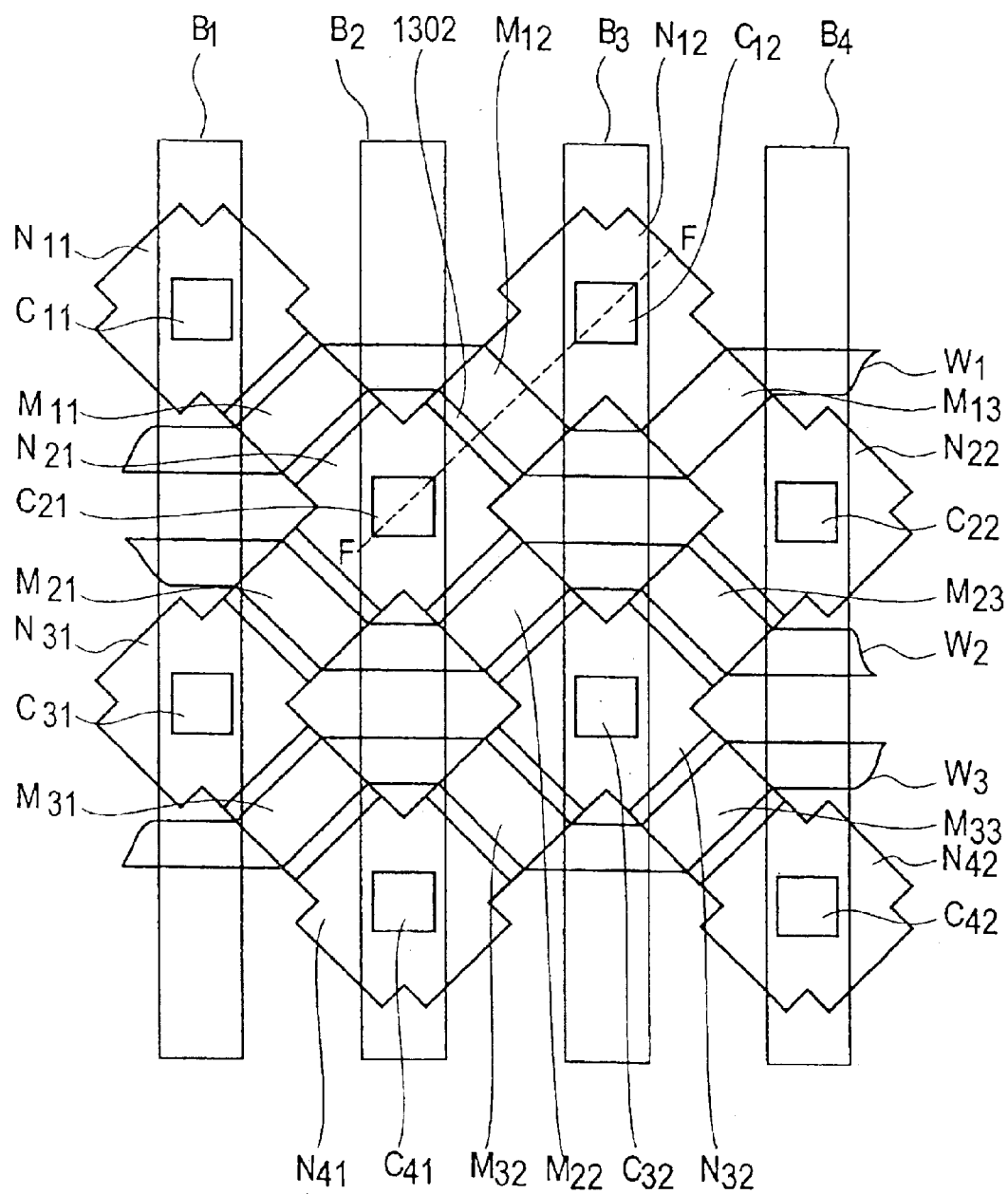
FIG. 12 is a plan view of the configuration of non-volatile Read Only Memory relating to a sixth aspect of the embodiment.

FIG. 12 is a plan view of the structure of a mask ROM relating to this aspect of the embodiment. FIG. 13 is a cross-section at F—F in FIG. 12. In FIGS. 12 and 13, structural elements with the same codes as in FIGS. 1 and 2 are the same as those elements in FIGS. 1 and 2.

Figure 13:
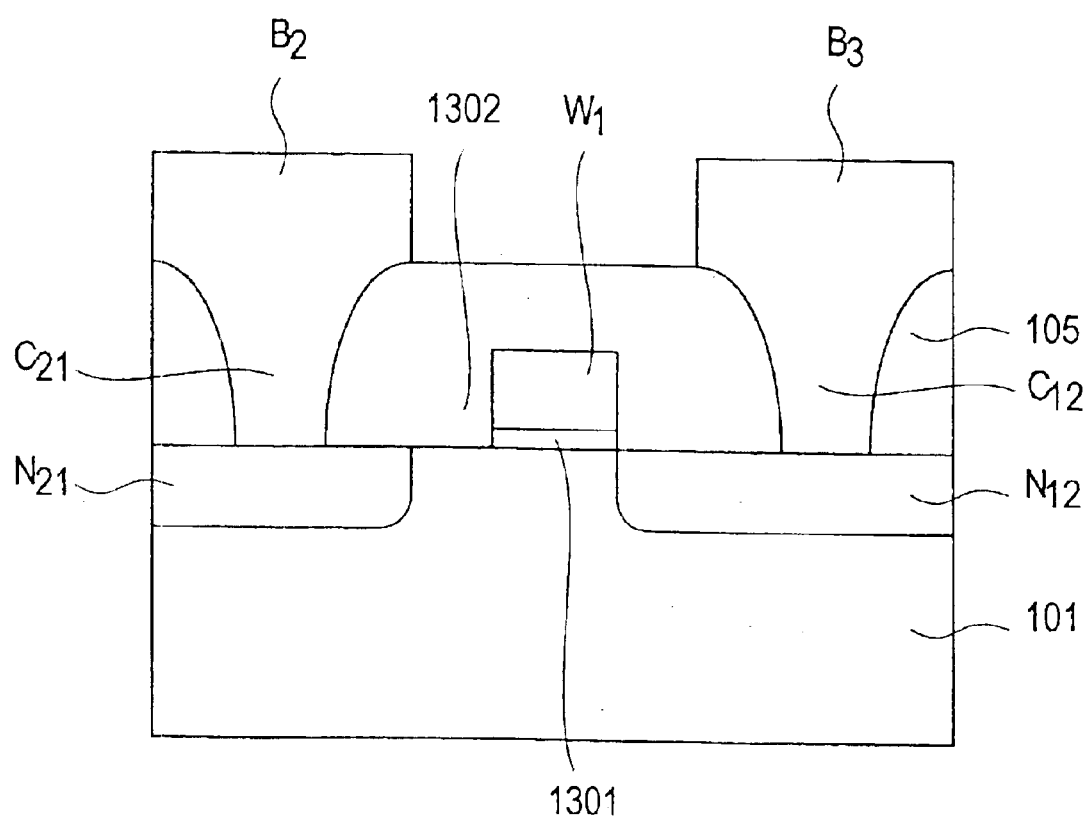
FIG. 13 is a cross-section at F—F in FIG. 12.

As shown in FIGS. 12 and 13, in the memory cell transistors used in this aspect of the embodiment, an gate oxide film 1301 is formed on the non-diffusion area on a semiconductor substrate 101. Word lines W11 through Wm are formed on this oxide gate film 1301.

In this aspect of the embodiment, a gap 1302 of the prescribed width is formed between the word line and n+ diffusion area N21 according to the value of written data (quaternary data). The width of this gap 1302 is set to a value that enables a current to flow between n+ diffusion areas N12 and N21 when n+ diffusion area N21 is used as a drain but that disable a current to flow between n+ diffusion areas N12 and N21 when n+ diffusion area N21 is used as a source. In other words, in this mask ROM, an offset structure is obtained by providing a gap 1302 of the prescribed width between the word line and n+ diffusion area when the n+ diffusion area is formed. Also, a non-offset structure is obtained by providing no gap between the word line and n+ diffusion area when the n+ diffusion area is formed In this aspect of the present embodiment, the stored value when gaps 1302 are provided for both n+ diffusion areas N21 and N12 is "11", the stored value when a gap 1302 is formed only for n+ diffusion area N12 is "10", the stored value when a gap 1302 is formed only for n+ diffusion area N21 is "01", and the stored value when a gap 1302 is not formed for either n+ diffusion area N21 or N12 is "00".

Next, an example of the method for writing data in the mask ROM of this aspect of the embodiment will be explained.

In this mask ROM, as with the usual ROM manufacturing process, an gate oxide film 1301 and word lines W11 through Wm are formed on a semiconductor substrate 101.

Next, n+ diffusion areas N11 through Nmn, which correspond to write data, are formed. The n+ diffusion areas N11 through Nmn can be formed, for example, by ion implantation using a high-energy implantation device.

Then, as in the usual ROM manufacture process, an oxide insulation film 105, contact holes C11 through Cmn, and bit lines B1 through Bn are formed and the process ends.

Next, an example of a method used for reading data in mask ROM relating to this aspect of the embodiment will be explained for a case in which data is read from a memory cell M12.

Firstly, by applying a high electric potential VDD to word line W11 (see FIG. 3), this word line W1 is selected.

Next, transistors TD2 and TS3 are turned on by selecting the drain selection line DS21 and the source selection line SS2. This causes a high electric potential VDD to be applied to bit line B2 and a low electric potential VSS to be applied to bit line B3. Accordingly, the n+ diffusion area N21 on the bit line B2 side becomes a drain and the n+ diffusion area N12 on the bit line B3 side becomes a source (see FIG. 13). In memory cell M12, the n+ diffusion area N21 takes on an offset structure (in other words there is a gap 1302) and so when n+ diffusion area N21 is used as a drain, memory cell transistor M12 is turned on. Therefore, the electric potential of bit line B3 rises. This means that "1" is read as the low order bit of quaternary data from this bit line B3.

Next, transistors TD3 and TS2 are turned on by selecting the drain selection line DS12 and the source selection line SS1. This causes a low electric potential VSS to be applied to bit line B2 and a high electric potential VDD to be applied to bit line B3. Accordingly, the n+ diffusion area N12 on the bit line B3 side becomes a drain and the n+ diffusion area N21 on the bit line B2 side becomes a source (see FIG. 13). In memory cell M12, the n+ diffusion area N21 takes on an offset structure (in other words there is a gap 1302) and so when n+ diffusion area N21 is used as a source, the memory cell transistor M12 is not turned on. Therefore, the electric potential of bit line B2 does not rise. This means that "0" is read as the high order bit of quaternary data from this bit line B2.

Likewise, stored value "11" can be read when gap 1302 is not formed for either n+ diffusion areas N21 or N12, stored value "10" can be read when a gap 1302 is formed only for n+ diffusion area N12, and stored value "00" can be read when a gaps are formed for both n+ diffusion area N21 and N12.

As explained above, the mask ROM relating to this aspect of the embodiment enables quaternary data to be written using the offset/non-offset structure of the memory cell transistors. The quaternary data can also be read by reversing the n+ diffusion area source and drain and reading information twice. Therefore, this aspect of the embodiment can read data with greater reliability than the mask ROM that stores differences in threshold values as quaternary data.

Also, in the mask ROM relating to this aspect of the embodiment, data is written depending on the size of the n+ diffusion areas and so fine adjustment is made possible by physically measuring the offset width. Accordingly, more accurate and stable manufacture is enabled and cell sizes can be refined easily.

In addition, in the mask ROM relating to this aspect of the embodiment, memory cell transistors are arranged in the shape of the letter X and word lines are formed in the shape of the letter M and so source and drain wiring can be implemented easily using not the diffusion layer but metal lines (bit lines B1 through Bn). Accordingly, fast and stable data reading is enabled through the use of the mask ROM relating to this aspect of the embodiment.

As explained above in detail, the present invention provides a non-volatile Read Only Memory that enables simple refining of cells and stable reading of data. Furthermore, it can provide a non-volatile Read Only Memory with a short TAT.

What is claimed is:

1. A non-volatile Read Only Memory manufacturing method, comprising:
 a first individual process for forming a gate oxide film on a semiconductor substrate, such that distance between opposite ends of said gate oxide film and impurity area formation areas are set so as to form an offset structure or a non-offset structure in accordance with quaternary writing data;
 a second individual process for forming a gate electrode on an entirety of said gate oxide film; and
 a third individual process for forming one impurity area and an other impurity area at a surface of said semiconductor substrate, such that the impurity areas are located at said impurity area formation areas.

2. The non-volatile Read Only Memory manufacturing method according to claim 1, wherein row selection lines are configured by forming gate electrodes in a same column as one entity.

3. A non-volatile Read Only Memory manufacturing method, comprising:
 a first common process for forming a gate oxide film on a semiconductor substrate;
 a second common process for forming a gate electrode on said gate oxide film;
 a third common process for forming one impurity area and an other impurity area at a surface of said semiconductor substrate, so that distances between opposite ends of said gate oxide film and said impurity areas correspond to a non-offset structure; and
 an individual process for forming an offset structure by providing trenches on boundary planes between the impurity areas and channel formation areas in accordance with quaternary writing data.

4. The non-volatile Read Only Memory manufacturing method according to claim 3, wherein said individual process is a process for forming said trenches by etching.

5. The non-volatile Read Only Memory manufacturing method according to claim 3, wherein row selection lines are configured by forming gate electrodes in one column as one entity.

6. A non-volatile Read Only Memory manufacturing method comprising:
 a first common process for forming a gate oxide film on a semiconductor substrate;
 a second common process for forming a gate electrode on said gate oxide film; and
 an individual process for forming one impurity area and an other impurity area at a surface of said semiconductor substrate, such that distances between said impurity areas and opposite ends of said gate oxide film are set so as to form an offset structure or a non-offset structure in accordance with quaternary writing data.

7. The non-volatile Read Only Memory manufacturing method according to claim 6, wherein row selection lines are configured by forming gate electrodes in a same column as one entity.

8. A non-volatile Read Only Memory manufacturing method, comprising:
 a common process for forming a gate insulator film on a semiconductor substrate, a gate electrode and a pair of non-conductive data write layers on said gate insulator film, and a pair of impurity areas at a surface of said semiconductor substrate,
 said non-conductive data write layers are respectively formed between said gate electrode and opposite ends of said gate insulator film, and said impurity areas are respectively formed so as to adjoin said opposite ends of said gate insulator film; and
 an individual process for forming non-offset structures by making said data write layers conductive in accordance with quaternary writing data.

9. The non-volatile Read Only Memory manufacturing method according to claim 8, wherein said common process comprises:
 a first common process for forming said gate insulator film on said semiconductor substrate;
 a second common process for forming said gate electrode on said gate insulator film so that gaps of a width corresponding to an offset structure are formed between said opposite ends of said gate insulator film and said gate electrode;
 a third common process for forming said impurity areas at the surface of said semiconductor substrate so as to adjoin with said gate electrode via said gaps; and
 a fourth common process for forming said non-conductive data write layers in said gaps on said gate insulator film, respectively.

10. The non-volatile Read Only Memory manufacturing method according to claim 9, wherein said individual process is a process for doping impurities into said data write layers using ion implantation.

11. The non-volatile Read Only Memory manufacturing method according to claim 9, wherein row selection lines are configured by forming said gate electrodes in a same column.

12. The non-volatile Read Only Memory manufacturing method according to claim 9, wherein said gate insulator film is an oxide film.

13. A non-volatile Read Only Memory manufacturing method comprising:

forming impurity areas at a surface of a semiconductor substrate;

forming gate insulator films on the surface of the semiconductor substrate between the impurity areas;

forming gate electrodes on the gate insulator films between the impurity areas;

forming offset structures between the gate electrodes and corresponding impurity areas by providing data write layers that are non-conductive on the gate insulator films between the gate electrodes and the corresponding impurity areas; and forming non-offset structures between the gate electrodes and other corresponding impurity areas by providing data write layers that are conductive on the gate insulator films between the gate electrodes and the corresponding impurity areas.

14. A non-volatile Read Only Memory manufacturing method comprising:

forming impurity areas at a surface of a semiconductor substrate;

forming gate insulator films on the surface of the semiconductor substrate between the impurity areas;

forming gate electrodes on the gate insulator films between the impurity areas;

forming offset structures by providing gaps in the gate insulator films and the gate electrodes, so that the gate insulator films and the gate electrodes are discontinuous with corresponding impurity areas; and forming non-offset structures by providing the gate insulator films and the gate electrodes as continuous with other corresponding impurity areas.

* * * * *